(12) United States Patent
Gomez et al.

(10) Patent No.: US 10,388,594 B2
(45) Date of Patent: Aug. 20, 2019

(54) PROTECTION FROM ESD DURING THE MANUFACTURING PROCESS OF SEMICONDUCTOR CHIPS

(71) Applicant: STMICROELECTRONICS, INC., Calamba (PH)

(72) Inventors: Frederick Ray Gomez, Calamba (PH); Tito Mangaoang, Jr., Pasig (PH); Jefferson Talledo, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 0 days.

(21) Appl. No.: 15/636,533

(22) Filed: Jun. 28, 2017

(65) Prior Publication Data

US 2019/0006266 A1    Jan. 3, 2019

(51) Int. Cl.
*H01L 21/48* (2006.01)
*H01L 21/56* (2006.01)
(Continued)

(52) U.S. Cl.
CPC ...... *H01L 23/4952* (2013.01); *H01L 21/4832* (2013.01); *H01L 21/56* (2013.01); *H01L 21/561* (2013.01); *H01L 22/12* (2013.01); *H01L 23/49548* (2013.01); *H01L 23/60* (2013.01); *H01L 23/3107* (2013.01); *H01L 24/29* (2013.01); *H01L 24/32* (2013.01); *H01L 24/48* (2013.01); *H01L 24/49* (2013.01); *H01L 24/73* (2013.01); *H01L 24/83* (2013.01); *H01L 24/85* (2013.01); *H01L 24/92* (2013.01); *H01L 2223/544* (2013.01); *H01L 2224/04042* (2013.01); *H01L 2224/2919* (2013.01); *H01L 2224/32245* (2013.01); *H01L 2224/48091* (2013.01); *H01L 2224/48247* (2013.01); *H01L 2224/49052* (2013.01); *H01L 2224/73265* (2013.01); *H01L 2224/83855* (2013.01);
(Continued)

(58) Field of Classification Search
CPC ............ H01L 23/49541; H01L 23/495; H01L 23/3107; H01L 23/49513; H01L 23/49582; H01L 24/85; H01L 23/49503; H01L 2224/29347; H01L 2924/181; H01L 23/49548; H01L 23/49575; H01L 2224/32245; H01L 2924/01029; H01L 24/48; H01L 2224/85; H01L 21/56; H01L 24/49; H01L 24/73; H01L 23/4952; H01L 2224/2919; H01L 23/60
USPC .................. 257/666–677, E23.031–E23.059, 257/E23.005–E23.009
See application file for complete search history.

(56) References Cited

U.S. PATENT DOCUMENTS 9,087,850 B2 * 7/2015 Fujisawa ............. H01L 21/4842
2011/0079888 A1 * 4/2011 Bathan ................ H01L 21/4832
257/676

(Continued)

*Primary Examiner* — Jasmine J Clark
(74) *Attorney, Agent, or Firm* — Seed IP Law Group LLP (57) ABSTRACT

According to principles of the disclosure as explained herein, selected leads are electrically connected through metal strips to the lead frame until the end of the manufacturing process. The lead frame is grounded through the manufacturing process to prevent any ESD event from causing damage to the protected leads. In the final singulation step, the leads are electrically isolated from each other and from the lead frame, thus maintaining protection from a potential ESD event up until the final package singulation step.

21 Claims, 7 Drawing Sheets

(51) Int. Cl.
*H01L 21/66* (2006.01)
*H01L 23/00* (2006.01)
*H01L 23/31* (2006.01)
*H01L 23/60* (2006.01)
*H01L 23/495* (2006.01)

(52) U.S. Cl.
CPC ............... *H01L 2224/85013* (2013.01); *H01L 2224/85424* (2013.01); *H01L 2224/85447* (2013.01); *H01L 2224/92247* (2013.01); *H01L 2224/97* (2013.01)

(56) References Cited

U.S. PATENT DOCUMENTS

2015/0200181 A1* 7/2015 Haga .................... B23K 20/005
　　　　　　　　　　　　　　　　　　　　438/127
2017/0162489 A1* 6/2017 Javier ............... H01L 23/49582

* cited by examiner

PROTECTION FROM ESD DURING THE MANUFACTURING PROCESS OF SEMICONDUCTOR CHIPS

BACKGROUND

Technical Field

This disclosure is in the field of protecting semiconductor dies from ESD events during manufacture and, in particular, maintaining electrical lead connection to the lead frame until the final singulation step.

Description of the Related Art

Semiconductor dies are susceptible to damage from electrostatic discharge. Electrostatic discharge can occur at various times during the handling of the semiconductor die, both during the manufacture and after the manufacture of the die. During the manufacturing process, the semiconductor die is connected to a lead frame. The lead frame contains an array of a large number of semiconductor dies. The lead frame remains as a single piece array during the entire manufacturing process, and at the end of the manufacturing process is singulated into individual packaged dies. It is important to protect each lead against and ESD event during the manufacturing process, up until the final singulation has taken place and the dies are packaged, ready to ship.

BRIEF SUMMARY

According to principles of the disclosure as explained herein, selected leads are electrically connected through metal strips to the lead frame until the end of the manufacturing process. The lead frame is grounded through the manufacturing process to prevent any ESD event from causing damage to the protected leads. In the final singulation step, the leads are electrically isolated from each other and from the lead frame, thus maintaining protection from a potential ESD event up until the final package singulation step.

According to a method as disclosed herein, a test is carried out to determine which leads are susceptible to ESD events during the manufacturing process. Generally, this may be between three and six leads per die, and the die having 50 to 100 leads. Subsequent to the test, the lead frame metallization is modified to provide metallization contacts from the lead frame to those leads that are susceptible to the ESD event. Thereafter, the lead frame is modified to add a metal connection from the lead frame directly to those leads which are susceptible to an ESD event. This ensures that those leads remain grounded during the entire manufacturing process. At the conclusion of the manufacturing process, the dies are singulated by sawing each die from the lead frame. The sawing process removes the electrical connection each lead from the lead frame and, therefore, electrically isolates each lead from each other and also from the lead frame itself.

Grounding some of the leads during the manufacturing process provides additional protection to avoid ESD events that may burn the leads, or the die attached thereto. By providing the connection via the lead frame which is subsequently sawed, the electrical connection to ground is automatically removed and the leads electrically isolated from each other during the singulation process. This provides an effective and low cost way of both providing ESD protection to the relevant leads and also effectively electrically isolates them at the conclusion of the manufacturing process.

DETAILED DESCRIPTION

Figure 1:
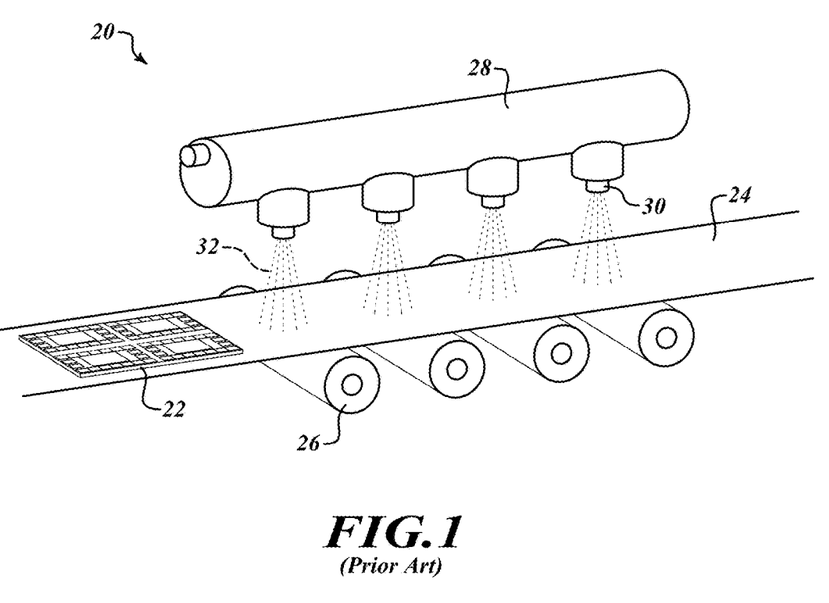
FIG. 1 is a schematic of a water jet cleaning station used during the manufacturing process as is known in the prior art.

FIG. 1 shows a system 20 to perform a conventional water cleaning step as is well known in the art today. According to this cleaning step, a lead frame array 22 having a large number of lead frames and, frequently, packaged dies attached thereto, is placed on a moving belt 24. The belt is advanced with rollers 26. As the belt 24 advances, a reservoir 28 outputs water 32 out of spray jet nozzles 30. The water is sprayed onto the lead frame array 22 as it advances along the moving belt 24. In some instances, the nozzles 30 are high pressure nozzles, which output the water at an extremely high pressure in order to more effectively clean all debris off of the lead frame array 22. In some instances, the water 32 exits as a water jet with sufficient pressure that it can remove metal burrs, stringers, and other debris from the lead frame array 22. It may also clean off the leads themselves to remove an outer oxide later which might be formed thereon and to leave packages extremely clean and free of all burrs and extraneous material just prior to sawing. The packages are, thus, made extremely clean prior to introducing them into the sawing process to avoid extraneous debris being created during the sawing.

Unfortunately, the water 32 may, from time to time, create ESD events for the leads of the lead frame 22. If the water is ejected at a very high pressure triboelectric charging may occur due to the impact of the high speed water molecules. Triboelectric charging on ESD sensitive devices tends to result in burnt metallization, and may, in some instances, damage not only the leads themselves, but also the circuits connected to the respective leads.

Figure 2:
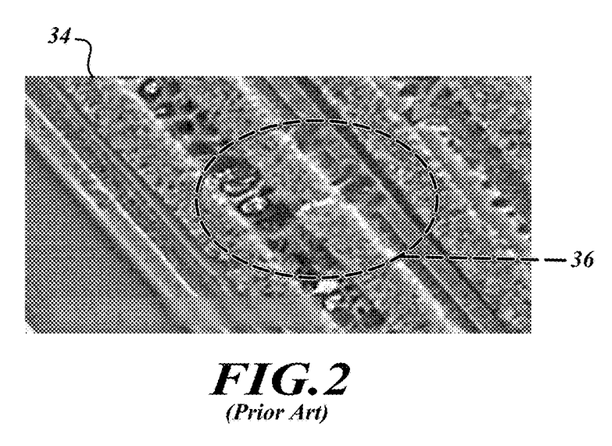
FIG. 2 is a photograph of ESD damage caused during the waterjet cleaning step of an unprotected lead.

FIG. 2 shows an example of a circuit on a die which has been damaged due to triboelectric charging during the water jet cleaning stage. As can be seen in FIG. 2, a pad 34 contains a damaged area within circle 36 which has burn marks due to an ESD discharge event, triboelectric charging, or other electric current flowing across the surface of the lead. If extensive damage is done during triboelectric charging, this may affect operation of the circuit, reducing the reliability of the production of individual packaged dies.

Figure 3:
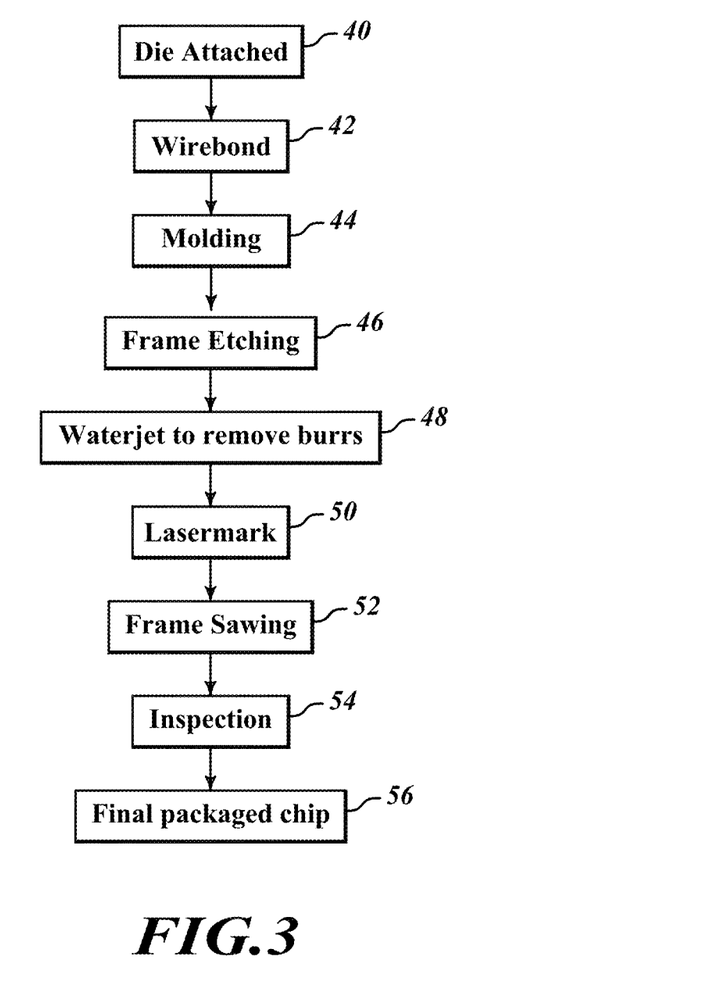
FIG. 3 is a flow diagram of a method of manufacturing an array of dies according to principles as disclosed herein.

FIG. 3 shows a sequence for manufacturing packaged dies according to principles of the inventive disclosure as discussed herein. In step 40, the die is attached to the lead frame. According to the principles discussed herein, the lead frame is an array of die pads and may have between 50 and 1,000 die pads with corresponding dies attached to each. After each die is attached to its respective die pad, the adhesive is cured, as is known in the art using standard adhesive curing techniques, and then a plasma clean, or other cleaning technique is carried out. Subsequently, a wire bond step 42 is carried out in which wires are coupled between the die and the lead frame using the standard wire bonding technique as is known in the art. After the wire bonding is completed and the appropriate cleaning and checking has taken place, the assembly is molded in a molding step and then the mold is cured in order to encapsulate the die having the lead frames wire bonded to the die. After the molding step, the lead frame is etched in step 46. During the frame etching, the copper plating lines are present which electrically connect all of the leads to each other. Prior to this step having been carried out, all of the leads are generally electrically connected to each other. Therefore, with the entire lead frame grounded, ESD events do not occur on the lead frame and, if there is an ESD event, it will be quickly grounded and will not damage the leads or the package. However, after the lead frame back etching has been carried out, each of the individual leads are electrically isolated from each other. Therefore, the respective leads are no longer connected to ground and, if a particular lead receives an ESD event, damage might occur.

After the frame etching, the packaged die is subjected to a water jet treatment to remove the burrs. This water jet treatment is carried out with the lead frame having the additional grounding connections coupled to selected leads to avoid ESD events as disclosed in more detail herein. Accordingly, the water jet cleaning step 48 does not cause ESD events and does not cause triboelectric charging burns to occur on any of the leads. After the water jet step, the packages are marked with the appropriate marking by any acceptable technique, such as the laser mark 50, silk screen printing, or any acceptable marking technique. After the appropriate marking, which may also include dot marking as is known in the art, the lead frame is sawed in the lead frame sawing step 52. In the lead frame sawing step 52, the individual packages are singulated from each other. Also, during the lead frame sawing step 52, the grounding wire for individual leads is cut from the lead from, thus electrically isolating all of the leads from each other and from the surrounding lead frame. This is explained and shown in more detail in herein.

After the lead frame sawing step 52, an inspection 54 is carried out to ensure that the package has been properly formed. In step 56, a final packaged die is prepared, ready to ship.

Figure 4:
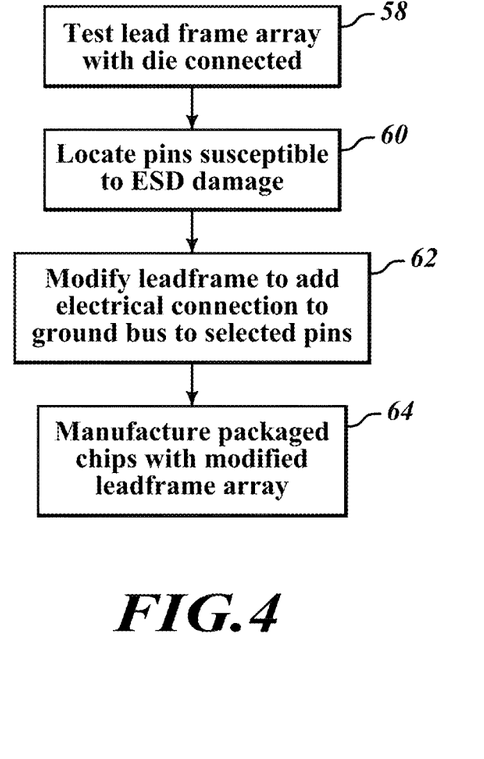
FIG. 4 is a method of testing lead frames to prepare them for manufacture according to the sequence of FIG. 3.

FIG. 4 illustrates the steps carried out to determine selected leads which need protection from an ESD event. As illustrated in FIG. 4, a lead frame is tested in step 58 to determine those leads of a die which are susceptible to ESD events or damage from triboelectric charging. There are a number of ways that this test 58 can be carried out. One technique is to have a fully functional lead frame with die connected pass through the water jet station to undergo full cleaning, at a very high pressure. The lead test at step 58 is carried out with an actual operating die for that package in one embodiment. After the lead frame has gone through the cleaning step, it can be inspected visually by an operator or by a machine to determine those leads which have suffered ESD events. The same lead frame design can be passed through the water jet cleaning station multiple times to determine those leads which are susceptible to damage during the cleaning step. This is a preferred technique to perform a test of the lead frame. Other techniques for testing the lead frame may include visually inspecting the lead frame for those leads which have burns. In some instances, it is more likely that leads that have burns will be subjected to triboelectric charging and, therefore, the general location of burns can be determined and these leads can be selected as susceptible to ESD damage.

As will be appreciated, if the testing steps 58 and 60 are carried out on a fully functional lead frame with the actual die of the lead frame attached and fully electrically connected, the test will be more accurate because it will respond to the actual final conditions of the package to be delivered to the customer. On the other hand, repeatedly testing fully operational, completed packages may result in the destruction of those packages and, thus, an economic loss. Accordingly, in one embodiment it is preferred to attach dummy die to the leads and, while bonding wires are attached the dummy die are not fully functional die and, therefore, the test becomes an effective test for sensitivity to the lead frame and the bonding wires. As a first test, this will be an acceptable test to locate those leads 74, which due to the lead frame construction of the bonding wires, are susceptible to ESD events. Accordingly, carrying out a first series of tests with just the lead frame alone and no die attached and a second series of tests with a dummy die will provide the benefit of locating some of the susceptible leads 74 without sacrificing any fully functional packages or lead frames. In addition, the testing can be carried out as part of the manufacturing process itself. Namely, after the manufacturing process has started and actual product is being completed for shipment to end customers, during the visual inspection a record can be made of those leads which are being damaged by ESD events. Using that record, in carrying out step 60, information can be provided to modify the lead frame of step 62 so that subsequent lead frames to be used in the manufacturing line have been modified to have the additional protected leads 74b.

Another way to detect ESD susceptible pins is to attach good dice on a leadframe and then subjecting the units to water jet with highly pressurize stream of water. On the other hand, separate good dice will be attached on leadframe but this will not be subjected to waterjet. The units are then singulated and are then electrically tested using an appropriate test program from the device engineers. Parametric responses from the electrical testing can then be compared and the ESD susceptible pins can be identified.

In one embodiment, it is possible to protect all leads. Namely, the additional electrical connections from the lead frame bus line 72 (see FIG. 5) can be provided to every single lead 74. While this can be carried out in some embodiments, testing has shown that this is unnecessary and unduly complicates the process. Generally, only a few leads 74 per package need to be protected. In some instances this may be one or two leads and usually is less than 10 leads on a package having in excess of 50 to 100 leads. Since adequate protection can be provided by testing the leads which are susceptible to an ESD event and protecting only those leads, saving of material and reliability is possible by protecting only those leads which need protection, rather than all leads. Thus, while one embodiment does contemplate protecting all leads, it is possible to perform some initial tests to determine those leads 74 which are susceptible ESD damage, and protecting just those leads provides high reliability of fully protecting the package while reducing the difficulty in the manufacturing process and the likelihood that some leads will be shorted together in the final package. As can be appreciated, if every lead 74 is protected, this makes the lead frame design substantially more complex, provides a greater likelihood that there will be an accidental shorting from one lead to another, and makes the final sawing step much more difficult and precise since there is more chance for error because of the large number of leads that must be electrically isolated from each other. Accordingly, it is preferred to just protect those leads for which testing has shown there is a susceptible to ESD damage.

Accordingly, in step 60 those leads which are susceptible to ESD damage are located following the testing step 58 and by inspection. After the leads are located in step 60, the lead frame is modified in step 62 to add electrical connections to selected leads. Those leads which are susceptible to ESD damage will be provided with an additional electrical grounding connection to the lead frame as shown later herein with respect to other figures.

After the lead frame has been modified in step 62, then the manufacturing of packaged dies proceeds in step 64 with the modified lead frame array. With the modified lead frame array having the additional electrical connections present, it is expected that none of the leads will suffer damage due to triboelectric charging or an ESD event. If a few of the leads are found to suffer damage, then this will serve as a second testing step 58 and will be another time the test step 58 is carried out. Those leads that are damaged will then be determined to have been located in step 60 and the lead frame will be modified again as set forth in step 62. This process can be repeated for each of steps 58 through 64 in order to confirm that all leads susceptible to damage have been located and protected as the manufacturing process is carried out for many products over an extended time period, such as several weeks or months.

Figure 5:
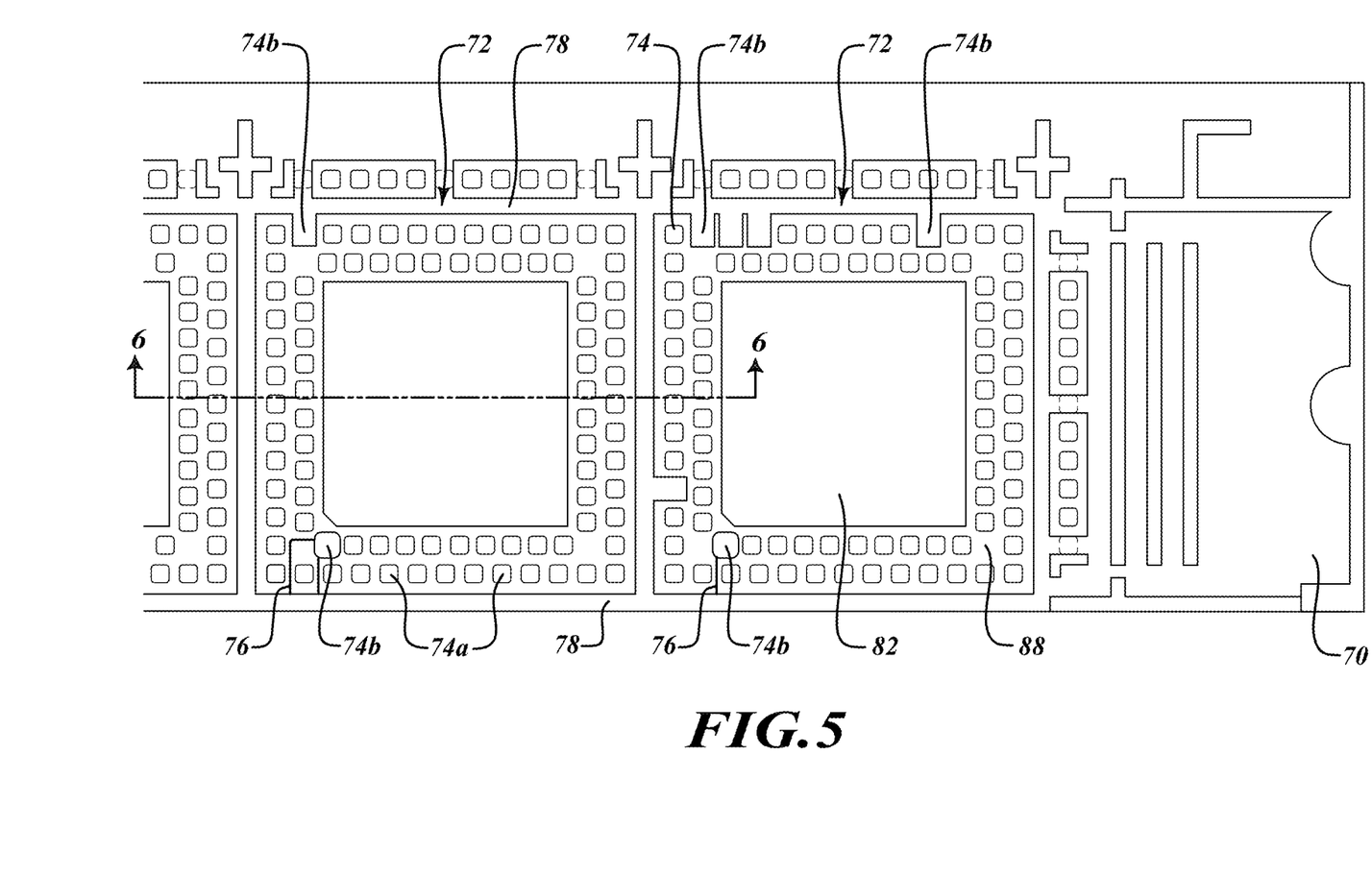
FIG. 5 is a bottom plan view of an inventive lead frame as disclosed herein.

FIG. 5 illustrates a lead frame array that has been modified as taught in step 62 of FIG. 4. In particular, FIG. 5 shows a lead frame array 70 which has thereon two full packages 72 which have been packaged and have dies encapsulated therein. Each package has thereon a plurality of leads 74. As can be seen, some of the leads labeled 74a are electrically isolated from all other leads and also from the lead frame itself. On the other hand, leads 74b are electrically isolated from other leads but are in a contiguous, electrical connection to the lead frame itself. Namely, the leads 74b have a metal layer of the lead frame, whether copper, aluminum, or other lead frame material, extending from the bulk of the lead frame material itself over the top of the package and overlying, and in physical contact with, the upper surface of the lead. This electrically connects such leads 74b to the lead frame. The lead frame will be grounded through the completion of the sawing step and, therefore, such dies will be protected from an ESD event because they will be grounded through the lead frame itself. With the leads 74 connected to the bus lines that are connected to the lead frame side rail 78, a large amount of current can be drawn away from the leads and, thus, prevent any damage due to triboelectric charging, an ESD event, or other electrical charge.

In a preferred embodiment, the lead connector to the bus lines 78 have a similar width dimension to the lead itself. This is shown by the lead connector for the leads 74b on the upper side of the right-most packaged die.

In some embodiments, the lead to be protected may be in an interior region of the package, as shown in the bottom region of the lead frame of FIG. 5. Of course, internal leads that need protection could occur at any location on the package, but are shown, for illustration purposes, to be present only in the bottom region of FIG. 5. For these leads, one or more thin lead lines 76 are connected to the lead 74b, thus providing the electrical connection to the bus lines 78 of the lead frame. In some instances, only a single lead line 76 is connected to each lead. In other instances, two or more lead lines 76 may be connected to a lead to provide a more robust and reliable current path, one example of which is illustrated in FIG. 5, lower right-hand corner. As will be appreciated, the lead lines 76 need to be sufficiently narrow to not electrically connect to adjacent leads 74 that carry different electrical signals than on the protected leads 74b and yet sufficiently broad to carry a current to protect from an ESD event.

Figure 6:
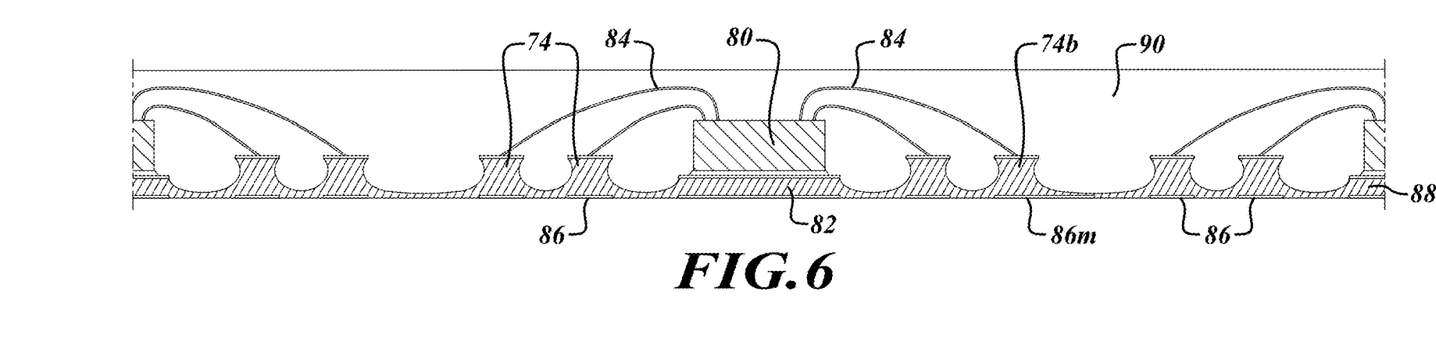
FIG. 6 is a cross-sectional view taken along line 6-6 of FIG. 5.
Figure 7:
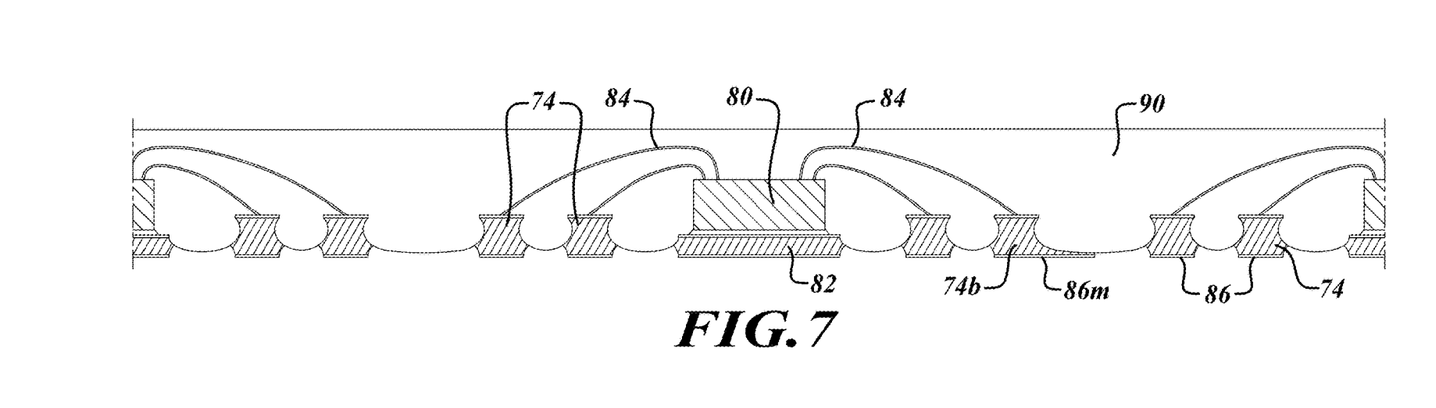
FIG. 7 is a cross-sectional view of FIG. 6 at a later stage in the manufacturing process.

FIGS. 6 and 7 are cross sections taken along line 6-6 of FIG. 5 to more fully illustrate the structure of the packaged die and lead frame at different steps in the process. FIG. 6 shows the cross-section view with a die 80 connected to the die pad 82. One or more bonding wires 84 connects the die 80 to individual leads 74. As can be seen, the leads 74 have a back side which is plated with an appropriate layer or set of layers 86. Preferred plating layers 86 include nickel alone, or a combination of nickel, palladium, gold, or other types of plating layers 86 as known in the art. The lead frame as shown in FIG. 6 is prior to what is called the back etch. Namely, prior to back etch, each of the dies in the entire lead frame are still connected through the plating metal lines which make up the lead frame itself. The main lead frame itself has a continuous layer 88, usually made of copper. This lead frame layer 88 electrically connects all of the leads to each other throughout the entire encapsulation process. When the frame 70 is placed in the mold, the layer 88 holds the entire lead frame together as a single continuous piece, with each of the leads electrically connected to the others. The die is then encapsulated in a molding compound 90. One encapsulated in the molding compound 90, the lead frame has a plurality of dies fully encased therein, ready for the next step.

FIG. 7 shows the lead frame array 70 after the back etch. Namely, as can be seen, the copper lead frame is etched away in all locations in which the plating layer 86 is not present. The etching of the copper material 88 electrically isolates each of the leads from each other. It also exposes the bottom of the molding compound 90 on the back side of the packaged die.

FIG. 5 shows the bottom of the lead frame in the state as shown in FIG. 6, with the thin copper layer electrically connecting all of the lead frames to each other and the individual leads, prior to the copper etching step. FIG. 7 shows the lead frame array 70 after the etching step, with the molding compound 90 now exposed. As can be appreciated, in black and white images of FIGS. 5 and 8, they look quite similar to each other since the only difference is that copper regions 88 have been removed between the individual leads, thus electrically isolating them from each other. The lead frame bus lines 78 remain, and continue to electrically connect the selected leads 74b to the main lead frame 70, which can be grounded.

FIGS. 6 and 7 also illustrate one example in which the lead frame has been modified to provide protection of a particular lead 74b. In particular, FIG. 6 shows a plurality of leads 74, each of which have a plating layer 86 on a bottom side thereof. During the removal of the copper lead frame material 88, a selective etch is carried out which is selective to remove copper and not remove the plating layer 86. As previously noted, the plating layer 86 may be a combination of nickel, nickel, palladium and gold, or other appropriate plating layer. Accordingly, the plating layer 86 acts as a mask to prevent etching of the copper 88 wherever it is present. The etching is carried out on the structure of FIG. 6 and the final etching can be seen in FIG. 7. As can be seen, in most instances, each of the leads 74 is electrically isolated from each the other leads. However, for one or more of the leads, it is desired to maintain the leads 74 connected to the lead frame bus line 78. For those lead frames for which it is desired to maintain the lead connected to the lead frame bus line 78, the pattern for the plating layer 86 is modified. In particular, FIG. 6 shows a modified plating layer 86*m* associated with the die 80 and the die pad 82. This modified plating layer 86*m* extends from the lead 74 to the bus line 78. The plating layer 86 acts as a mask for the etching of the copper that makes up the main lead frame 88. Accordingly, when the etching of the copper layer of the lead frame 88 is carried out that portion which is under the modified plating layer 86*m* remains. This creates a protective lead 74*b* in which the lead remains electrically connected to the bus line 78. A bottom plan view of this lead 74*b* can be seen in FIG. 5.

The use of the plating layer 86 as a mask for the etching of the lead frame 88 provides a very low cost, quick, and easy way to modify the lead frame to create protected lead 74*b*. In particular, the plating layer 86 is normally applied as a blanket layer, usually by electroplating, but it may also be applied by deposition or other technique. According to standard practice, the layer 86, after being deposited as a blanket layer, is selectively etched to leave the plating material 86 at those locations where it is desired to have it maintained, as shown in FIG. 6. According to principles of the inventive disclosure as provided herein, a simple change is made to the etching mask for the blanket layer 86. In particular, the etching of plating layer 86 is modified to leave a layer of the plating 86 at those locations on the package on which it is desired to have the leads 74 remain connected to the lead bus 78. The plating layer 86 will, therefore, protect the lead frame 88 during the etching of the copper and maintain the electrical connection from the particular lead 74*b* to the lead frame bus 78. While the layer 86 is a relatively thin layer, it acts as a mask during the etching process and, therefore, protects that portion of the lead frame which would otherwise be etched and serves to maintain full electrical connection between any particular selected lead 74*b* and the lead frame bus 78. This provides a simple, low cost, and very easy technique to modify the lead frame to provide electrical connection to those leads 74*b* for which ESD protection is desired.

As such, in an embodiment, a method of making a semiconductor package includes coating the second side of the lead frame with a second metal that is different from the first metal of the leadframe with a blanket layer and selectively removing the blanket layer at those locations in which it is desired to electrically isolate a lead from the lead frame and each other lead and leaving the coating layer on each individual lead and also in those locations not on a lead within the second set of leads which connect that lead to the lead frame bus line.

In an alternative embodiment, a method of making a semiconductor die package that is connected to a lead frame array includes: attaching a first operational semiconductor die to a first side of a first lead frame array; connecting a first end of an electrically conductive wire to the first die and a second end to a first side of the lead of the first lead frame array; encapsulating the first operational semiconductor die and the first side of the leads in a molding compound, each lead having a second side that is outside of the molding compound and each of the second sides of the leads being electrically connected to the lead frame array that electrically connects all leads to each other; passing the lead frame array through an electrostatic charge environment; removing a portion of the lead frame to electrically isolate all leads from each other and from the lead frame; inspecting the lead frame array to locate any leads that were damaged due to an ESD event during the step of passing the lead frame array through an electrostatic charge environment to located a damaged lead; modifying the design of the first lead frame array to create a second lead frame array having a different design that provides a current path to ground for the damaged lead from a lead frame bus; attaching a second operational semiconductor die to a first side of the second lead frame array; connecting a first end of an electrically conductive wire to the second die and a second end to a first side of the lead of the second lead frame array; encapsulating the second operational semiconductor die and the first side of the leads in a molding compound, each lead having a second side that is outside of the molding compound and each of the second sides of the leads being electrically connected to the second lead frame array that electrically connects all leads to each other; removing only a portion of the second lead frame to electrically isolate a first set of leads from all other leads but not removing a lead frame bus line connection for a second set of leads that leaves each lead of the second set of leads electrically connected to the lead frame bus line and to each other; passing the second lead frame array through an electrostatic charge environment; maintaining the second lead frame array at an electrical ground potential to provide an electric current path from the lead frame to ground during the electrostatic charge event; and cutting the semiconductor die package from the second lead frame array, the cutting including removing all electrical connection of each lead to the lead frame bus line and electrically isolating each the lead from all other leads of the semiconductor die package.

The embodiment of the method may further include: modifying the pattern of a coating layer that overlays the second lead frame array, the second lead frame being comprised of a first metal and the coating layer being comprised of a second metal. In one embodiment, the coating layer is applied by electroplating the second side of the second lead frame with the second metal. In one embodiment, etching of the second lead frame array with the modified coating layer in place, using the modified coating layer as a mask to prevent etching of selected portions of the second lead frame array is carried out.

An embodiment of a semiconductor package includes: a lead frame made of a first metal, the lead frame having a first side and a second side; a die pad that is a part of the lead frame; a plurality of leads that are part of the lead frame; a semiconductor die positioned on a first side of the die pad; a plurality of conductive wires that extend from the die to a first side of each respective lead; a molding compound that encapsulates the die, the wire, and the first side of each respective lead; an electrically conductive coating layer overlying the second side of the lead frame and positioned on the second side of each respective lead, the electrically conductive layer being made of a different material than the lead frame; an electrically conductive line that extends from the lead, on a bottom side of the package to the edge of the package, the lead being exclusively on the bottom side of the package and not having any portion thereof on a sidewall of the package; and a portion of molding compound that directly overlays the electrically conductive line.

The embodiment of the semiconductor package may further include: a width of the electrically conductive coating layer in a region between the lead and a side of the package being greater than the width of the lead; the lead that the electrically conductive line extends from being at least three times thicker than the electrically conductive line; the electrically conductive line comprised of at least a lead frame layer made of a first metal and a coating layer made of second metal; the lead frame layer being at least five times thicker than the coating layer; and the coating layer acting as a mask to prevent etching of the lead frame layer in an etching step.

As can be seen in FIG. 7, that portion of the lead frame 88 which is protected by the modified plating layer 86m remains unetched. This, therefore, creates the lead 74b which is connected to the lead frame bus line 78. While only a single example 74b is shown in FIGS. 6 and 7, it will be appreciated that by changing the pattern of the plating layer 86 any particular lead 74 can remain electrically connected to the lead frame bus 78 and, thus, have an ESD protection path provided, as shown in FIGS. 5 and 8.

As can be seen viewing FIGS. 6 and 7, the plating layer 86, as well as the modified region 86m, is a very thin layer. It is preferably applied as electroplating and will be in the range of five to ten times thinner than the most thin region of the lead frame 88. After the etching of the lead frame 88 is carried out between FIGS. 6 and 7, the lead 74b will have a conductive line extending therefrom which electrically connects to the lead frame bus 78. This conductive line will be relatively thin because its sole purpose is to provide electrical connection to the main lead portion of leads 74b. It is much thinner than the bulk of lead 74b, preferably two to three times thinner, and in some embodiments five times thinner. It does not have a plating layer on the top thereof because it will not receive a bonding wire 84. This conductive line is directly overlaid by the molding compound 90 and does not have any bonding wire connected to it and is not overlaid by a bonding wire. It extends to the edge of the package as shown in FIG. 9 and, as can be seen in FIG. 10, will be viewable as a very thin metallic tab that is adjacent to the edge of the package 96 and is flush with the edge, because the saw which cuts the package will also cut the metal lead 74b, leaving a portion of the lead 74b flush with the edge of the package.

Figure 8:
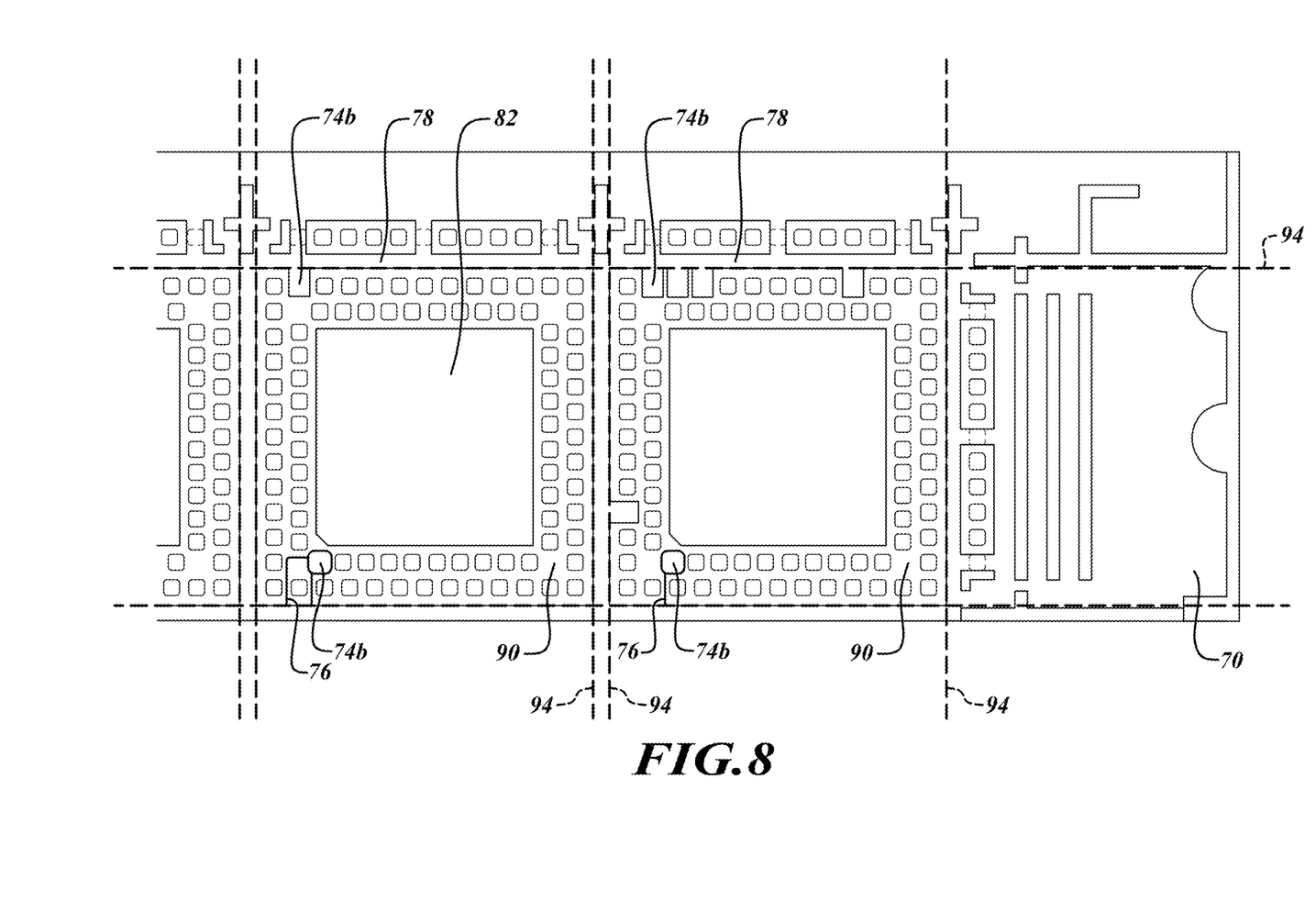
FIG. 8 is a bottom plan view of the lead frame array of FIG. 5 ready for cutting to perform singulation.

In the stage shown in FIG. 8, the lead frame array is subjected to the water jet cleaning. It can pass through a water jet cleaning station of the type known in the prior art as shown in FIG. 1. During this water jet cleaning, even if high pressure is used, the selected lead 74b will be protected from an ESD event, triboelectric charging, or other damage due to electrical charge overload. The leads 74b are electrically shorted to the bus 78.

After the appropriate water jet cleaning has been carried out, the individual packages are singulated from each other by sawing along saw lines 94. As can be appreciated, there are a plurality of saw lines 94 to remove all vestiges of the lead frame 70, the bus lines 78, and all common electrical connection. The selection for the location of the saw lines 94 will be made to ensure that all portions of the lead frame 70 are removed completely from the final package 96. In particular, the saw lines will be sufficiently close to the package that a small section of the package may, in fact, be cut during the sawing process. This will ensure that there are no electrical stringers between leads 74b in the event some of them happen to be adjacent to each other. In most instances, it is expected the leads will not be adjacent to each other and, therefore, it is sufficient that the saw removes all metal along the outermost edge. However, in some instances, one or more leads 74b may be adjacent to each other, in which case a more precise sawing is preferred to be carried out to ensure that all vestiges of the bus lines 78 are removed from the package as well as all parts of the lead frame 70 to fully and completely electrically isolate each of the leads 74.

Figure 9:
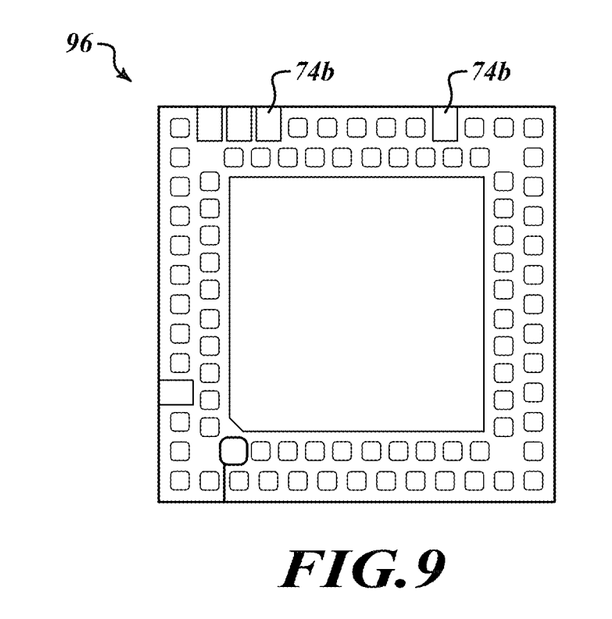
FIG. 9 is a singulated, final packaged die manufactured according to principles as disclosed herein.
Figure 10:
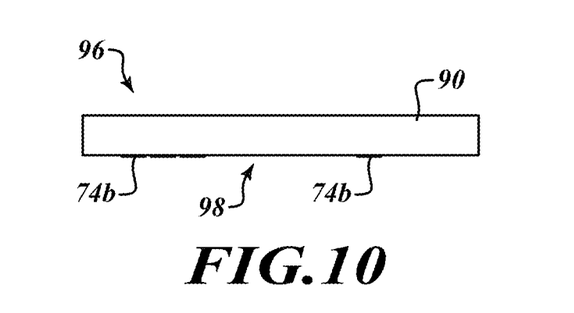
FIG. 10 is a side, elevational view of the final singulated package of FIG. 9.

FIG. 9 shows a final packaged die 96 in which all of the leads 74 are electrically isolated from each other. As can be seen, the leads 74b are still present, however, because their connection to the bus line 78 of the lead frame has been removed, they are now electrically isolated from each other. Namely, the ends of the leads 74 terminate at the molding compound edge and there is no metal connection that abuts against this metal lead line, therefore, each of the leads remains electrically isolated and can be appropriately soldered to a mother board or put to other use. In the final package, the leads 74b which have been protected will have the appearance of a slightly enlarged lead area, and will often have a lead area that extends adjacent to the edge of the package itself. Indeed, in some embodiments, the lead may be desired to have some metal region adjacent to the package edge to provide increased solder reliability.

FIG. 10 is a side, elevational view of the side that is uppermost in FIG. 9. As can be seen in FIG. 10, the package 96 includes molding compound 90. There are three leads 74 having a small, thin layer that reaches to the edge of the package 96 on the bottom side 98. These correspond to the three leads 74 of FIG. 9. As can be seen, these lead lines are very small, and therefore are not sufficient to provide sidewall soldering for electrical connection to the package. They also are electrically isolated from each other. This FIG. 10 illustrates that the metallic edge of the lead 74 is aligned with the very edge of the package since, when the saw cuts the package away from the lead frame array, it cuts the molding compound and the lead 74 at the same time, to electrically isolate each lead from the other and from the lead frame as a whole. In some instances, the saw will cut a small section of the package 96 in order to ensure that the entire lead frame is fully cut away to electrically isolate each of the leads 74.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor die package, comprising:
   a lead frame made of a first metal, the lead frame having a first side and a second side;
   a die pad that is a part of the lead frame;
   a plurality of leads that are part of the lead frame;
   a semiconductor die positioned on a first side of the die pad;

a plurality of conductive wires that extend from the die to a first side of each respective lead;
a molding compound that encapsulates the die, the plurality of conductive wires, and the first side of each respective lead;
an electrically conductive coating layer overlying the second side of the lead frame and positioned on the second side of each respective lead, the electrically conductive coating layer being made of a different material than the lead frame;
an electrically conductive line that extends from a lead, on a bottom side of the package to an edge of the package, the lead being exclusively on the bottom side of the package and not having any portion thereof on a sidewall of the package; and
a portion of molding compound that directly overlays the electrically conductive line.

2. The semiconductor die package of claim 1 wherein a width of the electrically conductive coating layer in a region between the lead and a side of the package is greater than a width of the lead.

3. The semiconductor die package of claim 2 wherein the lead that the electrically conductive line extends from is at least three times thicker than the electrically conductive line.

4. The semiconductor die package of claim 1 wherein the electrically conductive line is comprised of a lead frame layer made of a first metal and a coating layer made of second metal.

5. The semiconductor die package of claim 3 wherein the lead frame layer is at least five times thicker than the coating layer.

6. The semiconductor die package of claim 1 wherein the coating layer acts as a mask to prevent etching of the lead frame layer in an etching step.

7. The semiconductor die package of claim 1 wherein the electrically conductive coating layer is a plated layer.

8. A semiconductor die package, comprising:
a lead frame made of a first metal, the lead frame including:
 a first side and a second side;
 a die pad having a first side and a second side;
 a plurality of leads, each lead having a first side and a second side; and
 a protected lead having a first side and a second side, the protective lead coupled to an electrically conductive lead line that extends from the protected lead to a side edge of the package;
a die coupled to a first side of the die pad;
conductive wires coupling the die to the first side of the protected lead and the first side of each respective lead of the plurality of leads;
a molding compound that encapsulates the die, the conductive wires, the first side of the protected lead, and the first side of each respective lead of the plurality of leads; and
an electrically conductive coating layer overlying the second side of the lead frame and positioned on the second side of the protected lead, the second side of each respective lead of the plurality of leads and the second side of the die pad, the electrically conductive coating layer being made of a different material than the lead frame.

9. The semiconductor die package of claim 8 wherein the electrically conductive lead line is a first electrically conductive lead line of a pair of electrically conductive lead lines, the pair of electrically conductive lead lines being coupled to the protected lead and extending from the protected lead to the side edge of the package.

10. The semiconductor die package of claim 8 wherein the protected lead is a first protected lead of a plurality of protected leads and the electrically conductive lead line is a first electrically conductive lead line of a plurality of electrically conductive lead lines.

11. The semiconductor die package of claim 10 wherein each respective protected lead of the plurality of protected leads is coupled to a pair of respective electrically conductive lead lines of the plurality of the electrically conductive lead lines.

12. The semiconductor die package of claim 8 wherein the electrically conductive coating layer acts as a mask to prevent etching of the lead frame layer in an etching step.

13. A semiconductor die package, comprising:
a lead frame made of a first metal, the lead frame having a first side and a second side, the lead frame including a die pad and a plurality of leads;
a semiconductor die positioned on a first side of the die pad;
a plurality of conductive wires that extend form the die to a first side of each respective lead;
a molding compound that encapsulates the die, the plurality of conductive wires, and the first side of each respective lead;
an electrically conductive coating layer overlying the second side of the lead frame and positioned on the second side of each respective lead, the electrically conductive layer being made of a different material than the lead frame;
an electrically conductive line that extends from a first protected lead, on a bottom side of the package to an edge of the package, the first protected lead being exclusively on the bottom side of the package and not having any portion thereof on a sidewall of the package;
an electrically conductive lead line that extends from a second protected lead to a sidewall edge of the package, the second protected lead not having any portion thereof exposed on the sidewall of the package; and
a portion of the molding compound that directly overlays the electrically conductive line.

14. The semiconductor die package of claim 13 wherein the first protected lead is one of a plurality of first protected leads and the second protected lead is one of a plurality of second protected leads.

15. The semiconductor die package of claim 13 wherein the first protected lead is one of a plurality of exterior leads and the second protected lead is one of a plurality of interior leads.

16. The semiconductor die package of claim 15, further comprising:
an exterior region positioned between a perimeter of the package and the plurality of interior leads, the plurality of exterior leads being positioned within the exterior region; and
an interior region positioned between a perimeter of the die pad and the plurality of the exterior leads, the plurality of interior leads being positioned within the interior region.

17. The semiconductor die package of claim 16 wherein the first protected leads is one of a plurality of first protected leads and the electrically conductive line is one of a plurality of electrically conductive lines.

18. The semiconductor die package of claim 16 wherein the second protected lead is one of a plurality of second protected leads and the electrically conductive lead line is one of a plurality of electrically conductive lead lines.

19. The semiconductor die package of claim 16 wherein the electrically conductive lead line that extends from the second protected lead line to the edge of the package, passes between two adjacent exterior leads, the electrically conductive lead line having a size and a position to be electrically isolated from the two adjacent exterior leads.

20. The semiconductor die package of claim 19 wherein the electrically conductive lead line that passes between the two adjacent exterior leads carries a current to protect the second protected lead from an electrostatic discharge event during manufacture of the package.

21. The semiconductor die package of claim 14 wherein the electrically conductive coating layer acts as a mask to prevent etching of the lead frame layer in an etching step.

* * * * *

UNITED STATES PATENT AND TRADEMARK OFFICE
CERTIFICATE OF CORRECTION

| | | |
|---|---|---|
| PATENT NO. | : 10,388,594 B2 | Page 1 of 1 |
| APPLICATION NO. | : 15/636533 | |
| DATED | : August 20, 2019 | |
| INVENTOR(S) | : Frederick Ray Gomez et al. | |

It is certified that error appears in the above-identified patent and that said Letters Patent is hereby corrected as shown below:

Item (54) Title:
"PROTECTION FROM ESD DURING THE MANUFACTURING PROCESS OF SEMICONDUCTOR CHIPS" should read, --PROTECTION FROM ESD DURING THE MANUFACTURING PROCESS OF SEMICONDUCTOR DIES--.

Column 1, Line 3:
"SEMICONDUCTOR CHIPS" should read, --SEMICONDUCTOR DIES--.

Signed and Sealed this
Third Day of December, 2019

Andrei Iancu
*Director of the United States Patent and Trademark Office*